(12) United States Patent
Lee et al.

(10) Patent No.: US 6,642,109 B2
(45) Date of Patent: Nov. 4, 2003

(54) METHOD OF MANUFACTURING A FLASH MEMORY CELL

(75) Inventors: Seung Cheol Lee, Ichon-Shi (KR); Sang Wook Park, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/283,073

(22) Filed: Oct. 30, 2002

(65) Prior Publication Data

US 2003/0119263 A1 Jun. 26, 2003

(30) Foreign Application Priority Data

Dec. 22, 2001 (KR) .................................... 2001-0083491

(51) Int. Cl.[7] .......................................... H01L 21/8247
(52) U.S. Cl. ........................................ 438/257; 438/296
(58) Field of Search ................................ 438/257–267, 438/296, 593–594

(56) References Cited

U.S. PATENT DOCUMENTS 6,153,494 A  * 11/2000 Hsieh et al. ................. 438/424
2003/0054608 A1 *  3/2003 Tseng et al. ................. 438/257

* cited by examiner

*Primary Examiner*—Richard Booth
(74) *Attorney, Agent, or Firm*—Jacobson Holman PLLC

(57) ABSTRACT

A method of manufacturing a flash memory cell in which an ion implantation process is performed before a cleaning process for etching a protrusion of a trench insulating film to a nipple shape. As a result, the etch rate at a portion except for portions in which a moat will occur along the trench insulating film is increased. Therefore, generation of the moat in the trench insulating film can be prevented and spacing of the floating gate can be optimized.

7 Claims, 5 Drawing Sheets

METHOD OF MANUFACTURING A FLASH MEMORY CELL

BACKGROUND OF THE INVENTION

1. Field of the Invention

The invention relates generally to a method of manufacturing a flash memory cell and, more particularly, to a method of forming a self-aligned floating gate in a flash memory cell.

2. Description of the Prior Art

Generally, a flash memory cell is implemented by means of STI (shallow trench isolation) using a device isolation process. When isolating a floating gate using a mask patterning, wafer uniformity can be very poor due to variation in the critical dimension (CD). It is thus difficult to implement a uniform floating gate. There is also a problem in that program and erase failure of the memory cell, etc., may occur depending on variation in the coupling ratio.

Furthermore, with more highly integrated designs, if it is desired to implement a small space less than 0.15 μm, the mask process is made more difficult. Due to this, it makes difficult a method of manufacturing a flash memory functioning as an important factor in implementing a uniform floating gate. In addition, as the difference in the coupling ratio is increased if the floating gate is not formed uniformly, there is an over erase problem, etc. upon a programming and erasure of the memory cell, adversely affecting the characteristic of a device. Due to an increase in the mask process, the throughput of the product is lowered and the product cost is increased.

Therefore, in a 0.13 μm technology flash memory cell, the mask and etch processes for the floating gate are not implemented. Instead, the floating gate is formed by means of a self-aligned method. In the self-aligned method, however, there occurs a phenomenon by which a moat region is excessively cleaned by isotropic etch performed upon the cleaning process for etching the trench insulating film after STI process (CMP, chemical mechanical polishing). Due to this, the tunnel oxide film is made thin in a subsequent process and the characteristic of the entire device is degraded. Therefore, there is a need to increase the coupling ratio by securing a cell in which a moat does not occur in a highly integrated flash device.

SUMMARY OF THE INVENTION

The present invention is designed to solve the above problems. An object of the present invention is to provide a method of manufacturing a flash memory cell capable of optimizing the spacing of a floating gate as well as prohibiting generation of a moat in a trench insulating film, in a way such that an ion implantation process is performed before the cleaning process for etching a protrusion of the trench insulating film as a nipple shape having a given width, in order to increase the etch rate of portions except for a portion where the moat is generated among the protrusion of the trench insulating film.

In order to accomplish the above object, a method of manufacturing a flash memory cell according to the present invention comprises the steps of forming a pad oxide film and a pad nitride film on a semiconductor substrate; forming a trench in the semiconductor substrate; forming a trench insulating film on the entire structure and then performing a first chemical mechanical polishing (CMP) process to isolate the trench insulating film; removing the pad nitride film to expose a protrusion of the trench insulating film; performing an ion implantation process to dope the protrusion of the trench insulating film; performing a cleaning process to etch the protrusion of the trench insulating film by a given width; forming a first polysilicon layer on the entire structure and then performing a second CMP process to form an isolate floating gate; and forming a dielectric film and a second polysilicon layer on the entire structure and then performing a respective etch process to form a control gate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
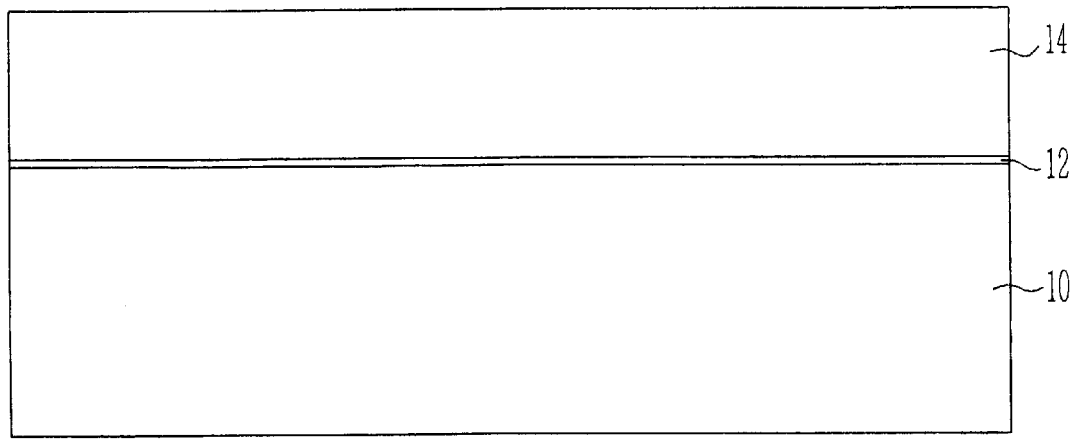
FIG. 1A to FIG. 1K are cross-sectional views of a flash memory cell for illustrating a method of manufacturing a flash memory cell according to one embodiment of the present invention.

The present invention will be described in detail by way of a preferred embodiment with reference to the accompanying drawings, in which like reference numerals are used to identify the same or similar parts throughout.

FIG. 1A to FIG. 1K are cross-sectional views of a flash memory cell for illustrating a method of manufacturing the flash memory cell according to one embodiment of the present invention.

Referring now to FIG. 1A, a pad oxide film 12 and a pad nitride film 14 are sequentially formed on a semiconductor substrate 10 cleaned by a pre-processing cleaning process. At this time, the pre-processing cleaning process is performed using DHF (diluted HF, typically a HF solution into which water is diluted at the ratio of 50:1) or BOE (buffer oxide etchant, which is a solution in which HF and $NH_4F$ are mixed at the ratio of 100:1 or 300:1).

Further, the pad oxide 12 is formed by performing a dry or wet oxidization method in order to process crystal defects on the surface of the semiconductor substrate 10 or perform the surface process. The pad nitride film 14 is formed at least 3000 Å in thickness by means of deposition process using LP-CVD (low pressure chemical vapor deposition) in order to increase the height of the protrusion of the trench insulating film formed in a subsequent process step.

Figure 1B:
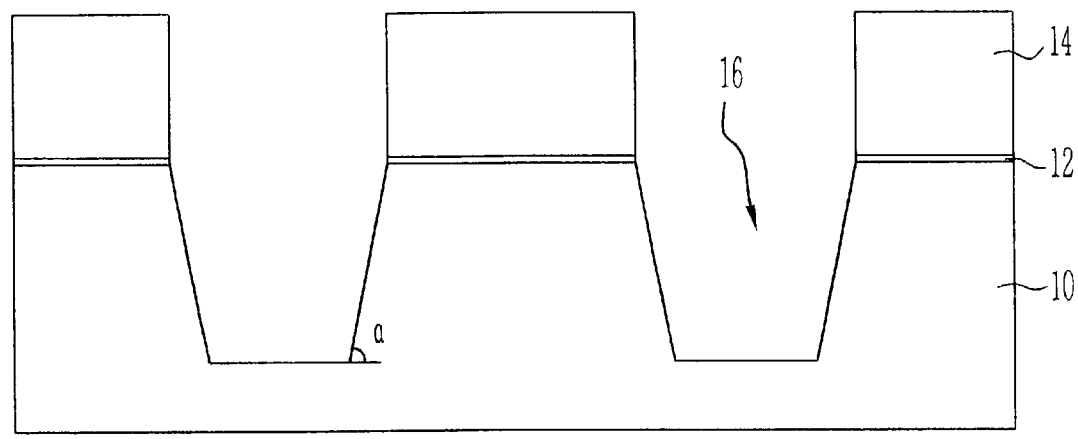

By reference to FIG. 1B, a STI process using an ISO mask is performed on the surface of the entire structure. Thus, a given portion of the semiconductor substrate 10, including the pad nitride film 14 and the pad oxide film 12, is etched to form a trench 16 through which a given portion of the semiconductor substrate 10 is exposed. As a result, the semiconductor substrate 10 is separated into an active region and an inactive region (that is, a region in which the trench is formed) by the trench 16. An internal inclination angle (α) of the trench 16 is about 75~85°. The pad nitride film 14 has an almost vertical profile.

Figure 1C:
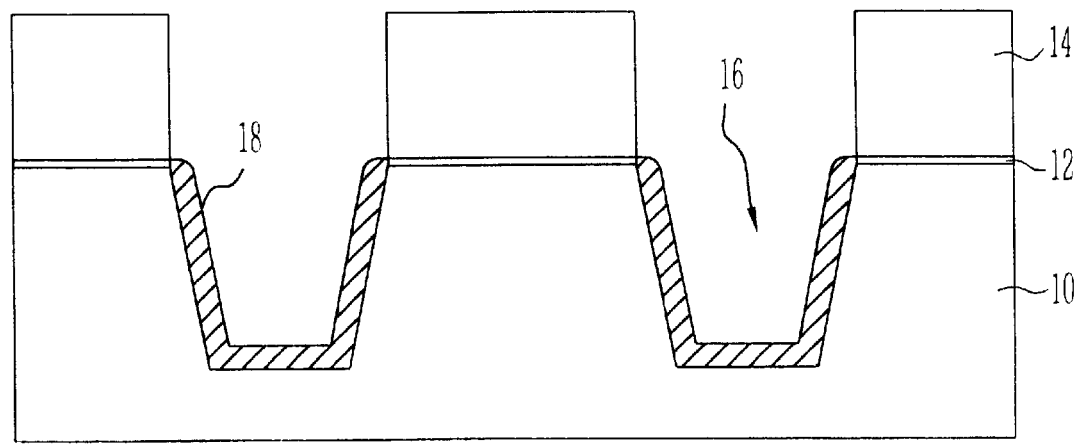

Referring to FIG. 1C, silicon located on an internal face of the trench 16 is grown by means of wall SAC oxidization process using a dry method to form a sacrifice oxide film 18 on an internal face of the trench 16. Meanwhile, in order to remove a native oxide film formed on an internal face of the trench 16 before the wall SAC oxidization process, a pre-processing cleaning process is performed using DHF or BOE.

Figure 1D:
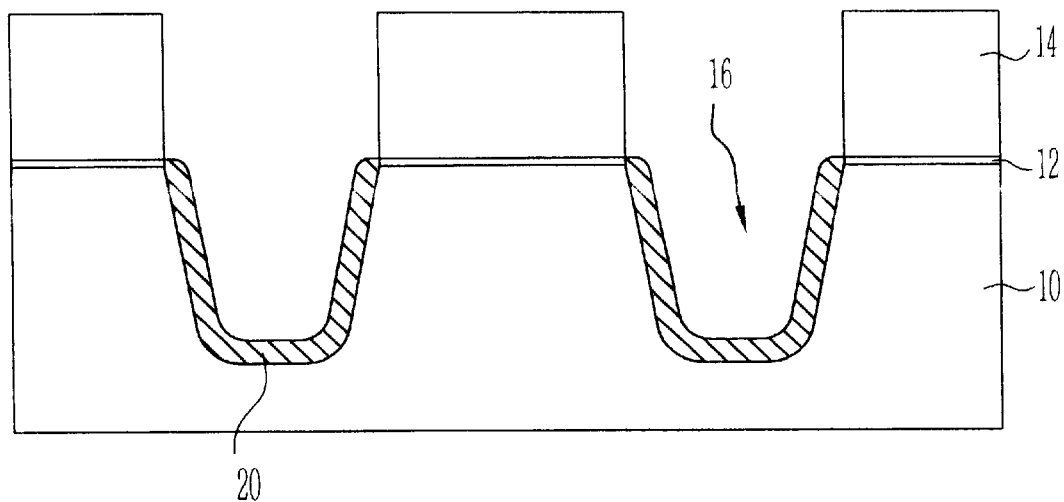

By reference to FIG. 1D, the sacrifice oxide film 18 is removed by performing a cleaning process using an etch target having the same thickness to a deposition target of the sacrifice oxide film 18. The wall oxidization process is performed in order to round the bottom of the trench 16, so that a wall oxide film 20 is formed on an internal face of the trench 16.

Figure 1E:
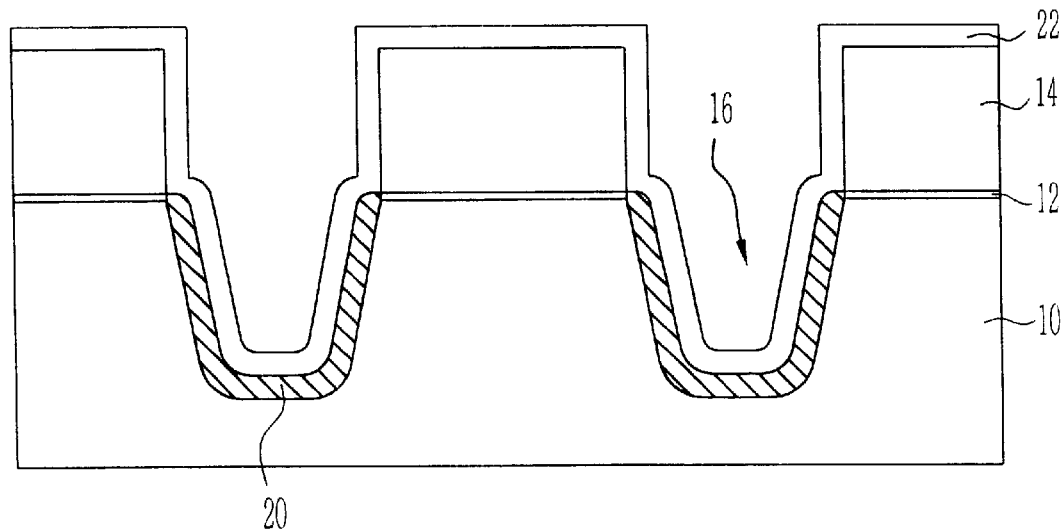

Referring now to FIG. 1E, after HTO (high temperature oxide) containing DCS ($SiH_2Cl_2$) as a basic component is thinly deposited on the entire structure, a smoothing process is performed at high temperature to form a liner oxide film 22. At this time, the smoothing process makes fine the texture of the liner oxide film 22, which increases the etch resistance. The smoothing process is performed at a high temperature of at least 1000° C. in order to reduce a leakage current while preventing formation of a moat occurring upon the STI process.

Figure 1F:
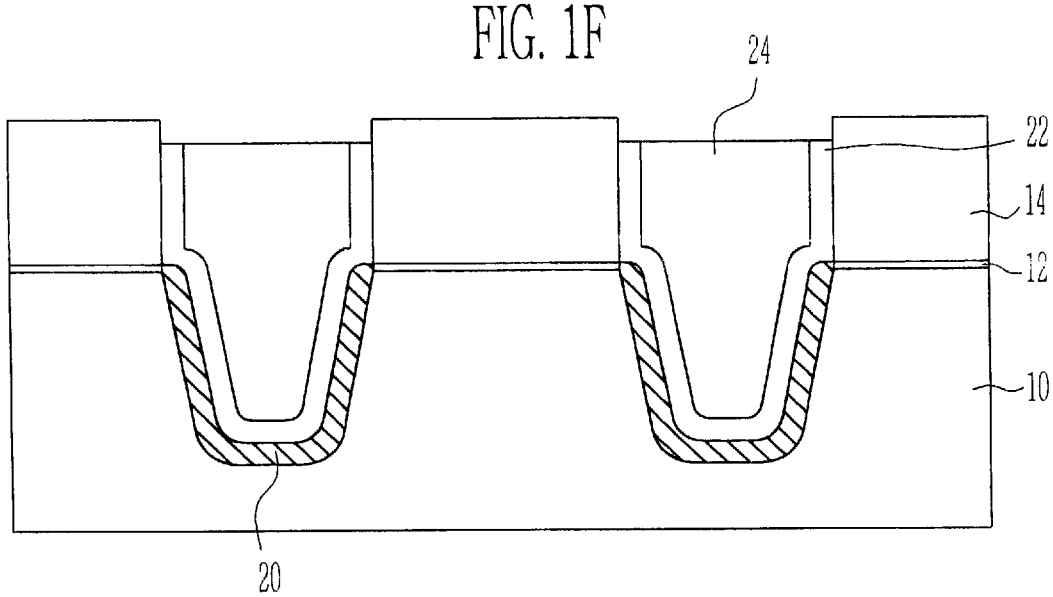

Referring to FIG. 1F, after a HDP oxide film for use in a trench insulating film is formed on the entire structure, a chemical mechanical polishing (CMP) process is performed to form a trench insulating film 24 which acts to bury the trench 16. At this time, the HDP oxide film for use in the trench insulating film is formed by a gap filling process so that void does not occur within the trench 16.

Further, the CMP process is performed using the pad nitride film 14 as an etch stopper until the pad nitride film 14 is exposed. Next, in order to remove the trench insulating film 24 that may exist on an upper surface of the pad nitride film 14, the cleaning process using HF or BOE is performed. Thus, the trench insulating film 24 is over-etched by a given thickness relative to the pad nitride film 14, as shown.

Figure 1G:
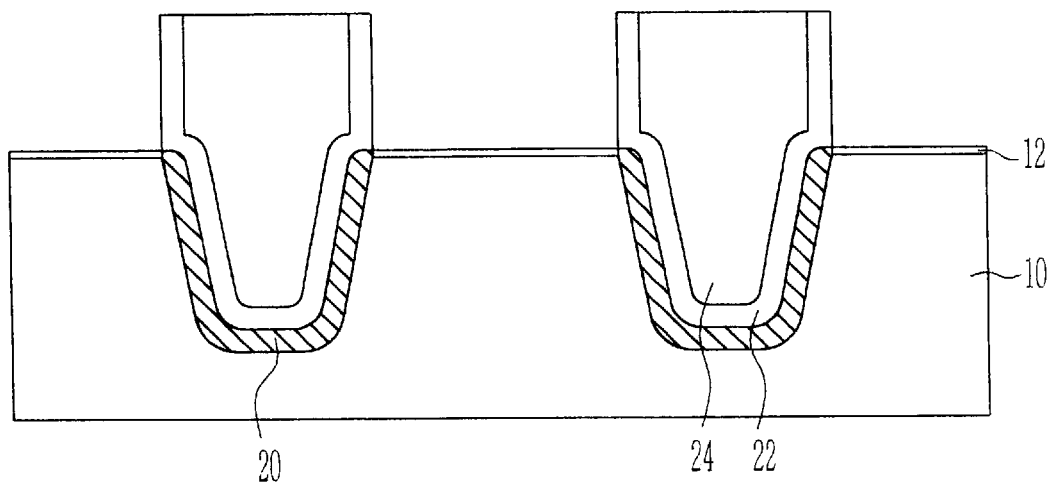

By reference to FIG. 1G, the cleaning process using the pad oxide film 12 as an etch stopper is performed to etch the pad nitride film 14 except for the trench insulating film 24 until the pad oxide film 12 is exposed. Thus, the trench insulating film 24 having a protrusion structure on an upper surface thereof is formed. At this time, the pad oxide film 12 is used as a passivation layer for passivating the active region upon an ion implantation process of the trench insulating film 24.

Figure 1H:
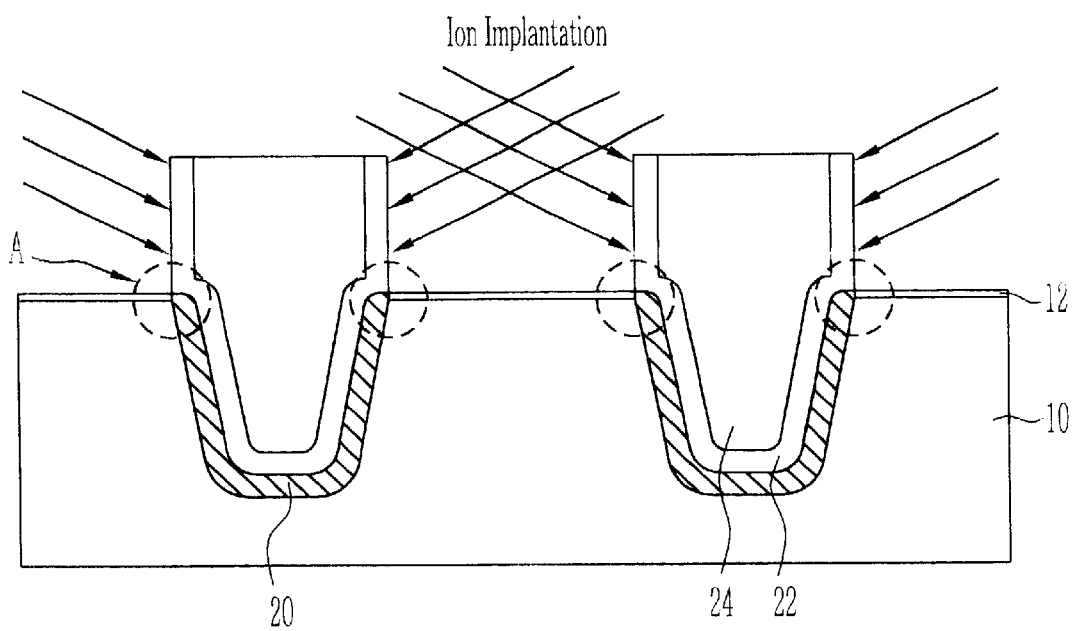

Referring now to FIG. 1H, an ion implantation process is performed at a relatively high tilt angle of 0~80° with the mask not formed. Ions are thus injected into a portion except for a portion (A) in which a moat frequently occurs along the protrusion of the trench insulating film 24.

This is because it is possible to inject ions only into a portion except for the portion (A) in which the moat frequently occurs along the protrusion of the trench insulating film 24 by setting the ion injection angle in the range of 0~80° and the twist angle in the range of 0~360° upon the ion implantation process, using the adjacent protrusion of the trench insulating film 24 as a shield element. Also, the ion implantation process is performed using boron (B), phosphorous (P) and arsenic (As) having the dose of 1E10~1E13 ions/$cm^3$ with a low ion implantation energy of 2~5 KeV in order to optimize damage of the portion into which ions are injected.

Meanwhile, as ions are injected only into a portion except for the portion (A) in which the moat frequently occurs along the protrusion of the trench insulating film 24 by the above method, damage is caused by implanting ions into all the portions except for the portion (A) in which the moat frequently occurs. Due to this, the etch rate of the portion along the protrusion in the trench insulating film 24 into which ions are injected is higher than that portion into which ions are not injected. Thus, upon a subsequent cleaning process, the portion along the protrusion in the trench insulating film 24, into which ions are injected is etched faster than the portion (A) into which ions are not injected.

Figure 1I:
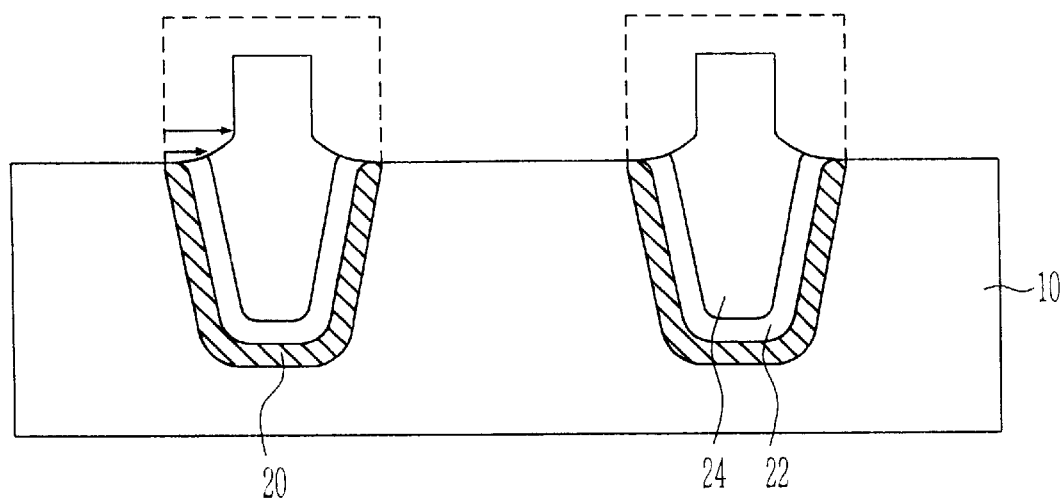

Referring now to FIG. 1I, the cleaning process is performed using an upper surface of the semiconductor substrate 10 as the etch barrier layer. Thus, the protrusion of the trench insulating film 24 is etched while the pad oxide film 12 is completely removed, thus forming a trench insulating film 24 having a nipple shape. At this time, the cleaning process may include a wet method using a solution in which HF and $NH_4OH$ are mixed at a given ratio for about 250~550 seconds or a dry method using HF may be used.

At this time, as described in FIG. 1H, the portion damaged due to injected ions along the portions of the trench insulating film 24 is etched faster than the portion (A) into which ions are not injected. Thus, generation of the moat in the portion (A) into which ions are not injected is prohibited and an optimized pattern around the portion into which ions are injected can be formed. In other words, the etch rate at a portion where the moat frequently occurs is reduced by the ion process to a degree indicated by the arrows shown in FIG. 1I, so that an etch margin for forming an optimized pattern at a portion into which ions are injected upon the cleaning process can be secured.

Thereafter, a screen oxide film (not shown) is formed on the active region by means of wet or dry oxidization method at a given temperature. An ion implantation process to form a well and an ion implantation process to control a threshold voltage are then performed to form a well region and an impurity region (not shown).

Figure 1J:
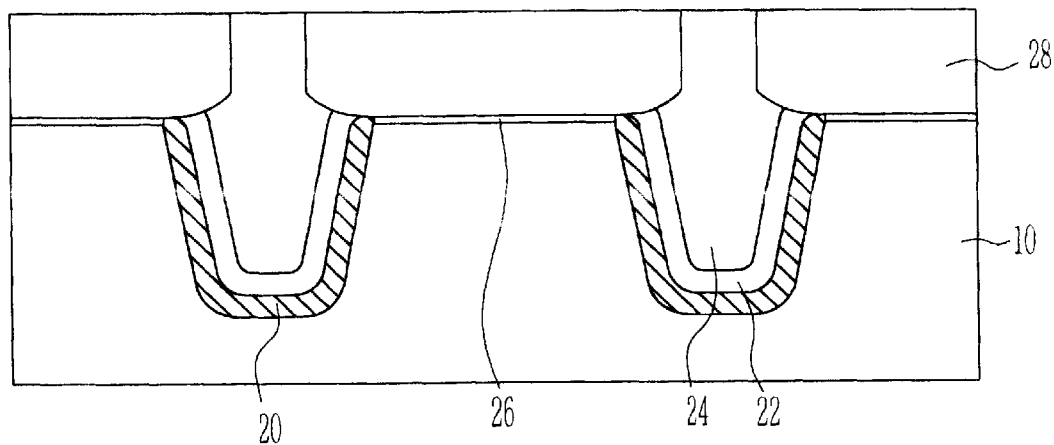

By reference to FIG. 1J, the cleaning process using DHF or BOE is performed to remove the screen oxide film. A tunnel oxide film 26 is then formed at a portion from which the screen oxide film is removed. Next, a first polysilicon layer for use in a floating gate is formed on the entire structure. Thereafter, a CMP process using the trench insulating film 24 as an etch stopper is performed to polish a given portion of the first polysilicon layer, so that a floating gate 28 isolated by the trench insulating film 24 is formed.

Figure 1K:
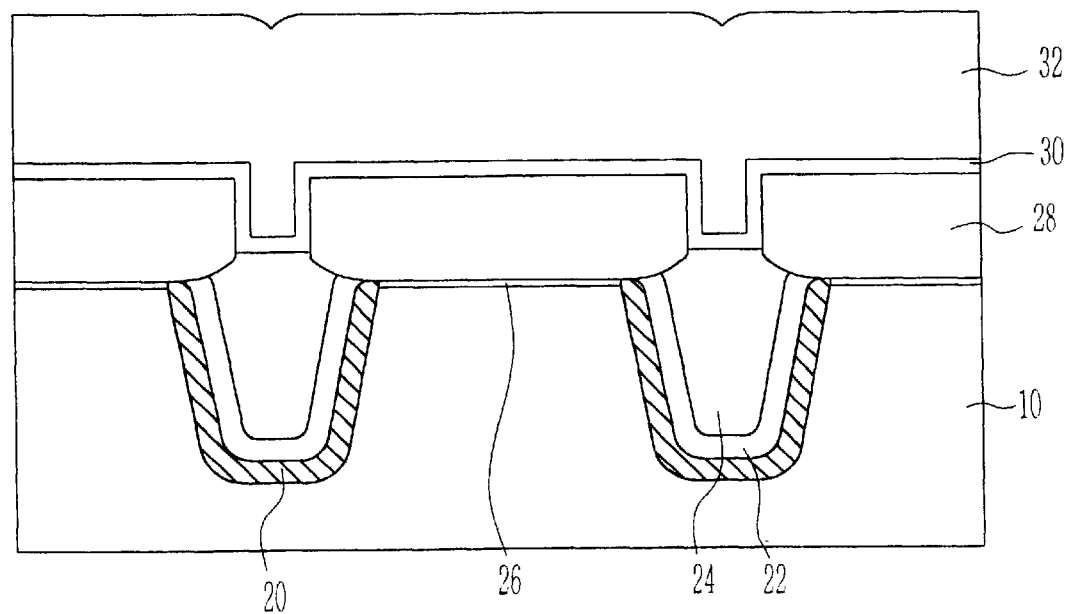

Referring now to FIG. 1K, a cleaning process is performed to etch, to a desired target, the trench oxide film 24 protruding between the floating gates 28 in a nipple shape. A dielectric film 30 having an ONO (oxide/nitride/oxide) structure or an ONON (oxide/nitride/oxide/nitride) structure and a second polysilicon layer 32 for use in a control gate are then sequentially deposited. Next, they are patterned by a given etch process to form a control gate (not shown).

As mentioned above, according to the present invention, an ion implantation process before a cleaning process for etching a protrusion of a trench insulating film into a nipple shape having a given width is performed to increase the etch rate of portions except for a portion where a moat may occur along protrusions of the trench insulating film. Therefore, the present invention has advantages that generation of the moat in the trench insulating film can be prohibited and spacing of the floating gate can be optimized.

Further, according to the present invention, there is an advantage in that it can prevent thin. formation of a tunnel oxide film by performing an ion implantation process to prevent generation of a moat.

In addition, as the cleaning process including etching the trench insulating film is selectively performed, the overall profile of the flash memory cell can be improved and an electrical characteristic can also be improved.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory cell, comprising the steps of:

forming a pad oxide film and a pad nitride film on a semiconductor substrate;

forming a trench in the semiconductor substrate;

forming a trench insulating film on the entire structure and then performing a first chemical mechanical polishing (CMP) process to isolate the trench insulating film;

removing the pad nitride film to expose a protrusion of the trench insulating film;

performing an ion implantation process to dope the protrusion of the trench insulating film;

performing a cleaning process to etch the protrusion of the trench insulating film by a given width, thereby forming a first resulting structure;

forming a first polysilicon layer on the first resulting structure and then performing a second CMP process to form an isolated floating gate thereby forming a second resulting structure; and forming a dielectric film and a second polysilicon layer on the second resulting structure and then performing respective etch processes to form a control gate.

2. The method as claimed in claim 1, wherein said ion implantation process is performed only for a portion formed on the pad oxide film with the pad oxide film intervened there between, along the protrusions.

3. The method as claimed in claim 2, wherein said pad oxide film is used as a passivation film for passivation of an upper surface of the semiconductor substrate upon the ion implantation process.

4. The method as claimed in claim 1, wherein said ion implantation process is performed at an ion implantation angle of 0~80° in a rotating range of 0~360°.

5. The method as claimed in claim 1, wherein said ion implantation process is performed using one of boron, phosphorous and arsenic having a dose of 1E10~1E13 ions/cm$^3$ with a low ion implantation energy of 2~5KeV.

6. The method as claimed in claim 1, wherein said cleaning process is a wet method using a solution in which HF and $NH_4OH$ are mixed at a given ratio for 250~550 seconds.

7. The method as claimed in claim 1, wherein said cleaning process is a dry method using HF.

* * * * *